United States Patent
Fischer et al.

(10) Patent No.: US 6,495,859 B2
(45) Date of Patent: Dec. 17, 2002

(54) OPTO-ELECTRONIC COMPONENT MADE FROM II-VI SEMICONDUCTOR MATERIAL

(75) Inventors: Frank Fischer, Würzburg (DE); Hans-Jürgen Lugauer, Gerbrunn (DE); Thomas Litz, Würzburg (DE); Gottfried Landwehr, Würzburg (DE); Andreas Waag, Würzburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/876,768

(22) Filed: Jun. 7, 2001

(65) Prior Publication Data

US 2001/0025954 A1 Oct. 4, 2001

Related U.S. Application Data

(62) Division of application No. 09/068,138, filed on May 1, 1998, now Pat. No. 6,265,734.

(30) Foreign Application Priority Data

Nov. 13, 1995 (DE) .......................................... 195 42 241

(51) Int. Cl.$^7$ ............................................... H01L 33/00
(52) U.S. Cl. ........................................... 257/97; 257/94
(58) Field of Search .................................. 257/92, 97

(56) References Cited

U.S. PATENT DOCUMENTS

| | | |
|---|---|---|
| 5,198,690 A | 3/1993 | Kitagawa et al. |
| 5,268,918 A | 12/1993 | Akimoto et al. |
| 5,422,902 A | 6/1995 | Mensz |
| 5,466,950 A | 11/1995 | Sugawara et al. |
| 5,548,137 A | 8/1996 | Fan et al. |
| 5,696,389 A | * 12/1997 | Ishikawa et al. ............... 257/99 |

FOREIGN PATENT DOCUMENTS

| | | |
|---|---|---|
| DE | 43 30 756 | 3/1995 |
| EP | 0 556 461 | 8/1993 |
| JP | 6-152061 | 5/1994 |
| JP | 7-66494 | 3/1995 |
| JP | 7-211988 | 8/1995 |
| JP | 7-232999 | 9/1995 |
| JP | 8-148765 | 6/1996 |
| WO | WO 94/15369 | 7/1994 |

OTHER PUBLICATIONS

Ishibashi "II–VI Blue–Green Laser Diodes", *IEEE Journal of Selected Topics in Quantum Electronics*, vol. 1, No. 2, Jun. 1995, 1995, pp. 741–748.

Dandrea et al, "Design of ohmic contacts to p–ZnSe", *Appl. Phys. Lett.*, vol. 64, No. 16, Apr. 18, 1994, pp. 2145–2147.

Mensz, "BeTe/ZnSe graded band gap ohmic contacts to p–ZnSe", *Appl. Phys.Lett.*, vol. 64, No. 16, Apr. 18, 1994, pp. 2148–2150.

Esaki, "The Evolution of Semiconductor Quantum Structures in Reduced Dimensionality–Do–It–Yourself Quantum Mechanics", *Electronic Properties of Multilayers and Low–Dimensional Semiconductor Structures*, 1990, pp. 1–24.

Strass et al, "Quantum–Well Laser—The New Generation of Semiconductor Lasers", *Laser und Optoelectronik*, vol. 26, No. 3, 1994, pp. 59–67.

Reuscher et al, "Blue light emitting diode based on p$^+$–BeTe/n$^+$–ZnSe ESAKI tunnelling heterojunction", *Electronics Letters*, vol. 26, No. 12, Jun. 8, 2000, pp. 1056–1058.

* cited by examiner

*Primary Examiner*—Olik Chaudhuri
*Assistant Examiner*—Douglas A. Wille
(74) *Attorney, Agent, or Firm*—Schiff Hardin & Waite

(57) ABSTRACT

A component has an active layer, barrier layers and, if appropriate, a buffer layer and at least one of these layers contains a beryllium-containing chalcogenide. The active layer is a multiple layer, for example a superlattice made of BeTe/ZnSe or of BeTe/ZnCdSe. When using an active layer of ZnSe on a substrate of GaAs, matching with low electrical resistance is achieved between the III–V materials and the II–VI materials by means of a pseudo-graded buffer layer including a beryllium-containing chalcogenide.

4 Claims, 2 Drawing Sheets

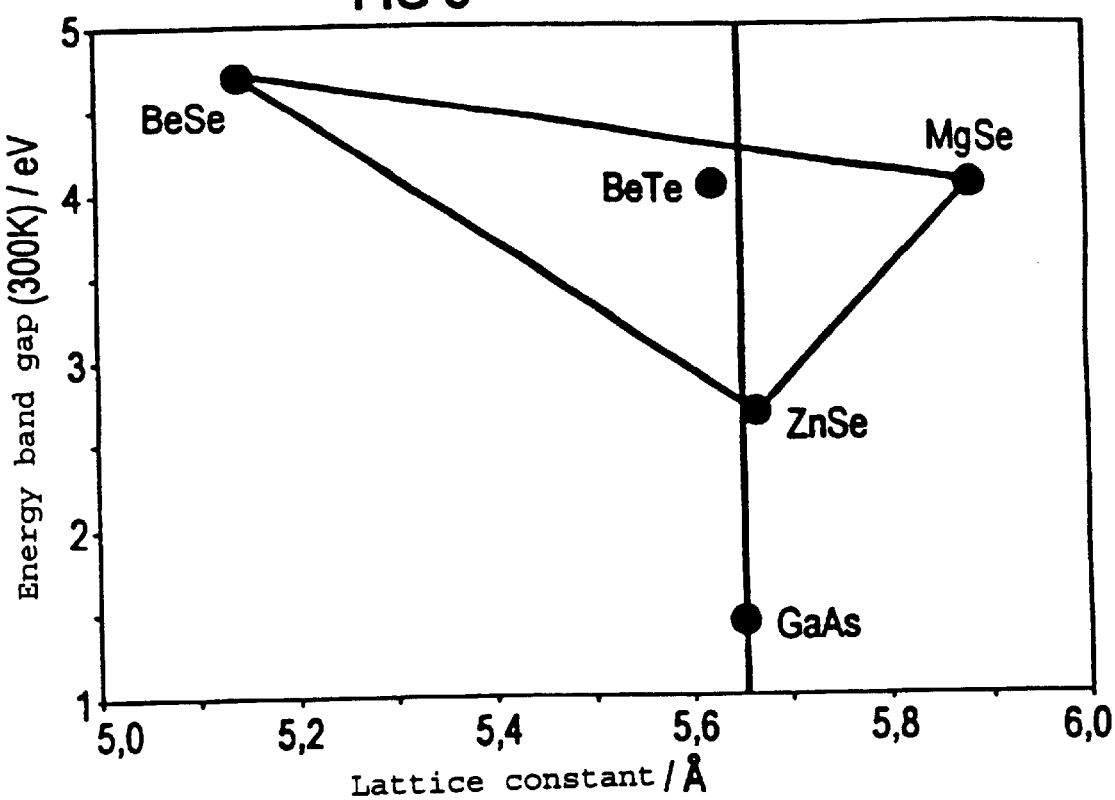
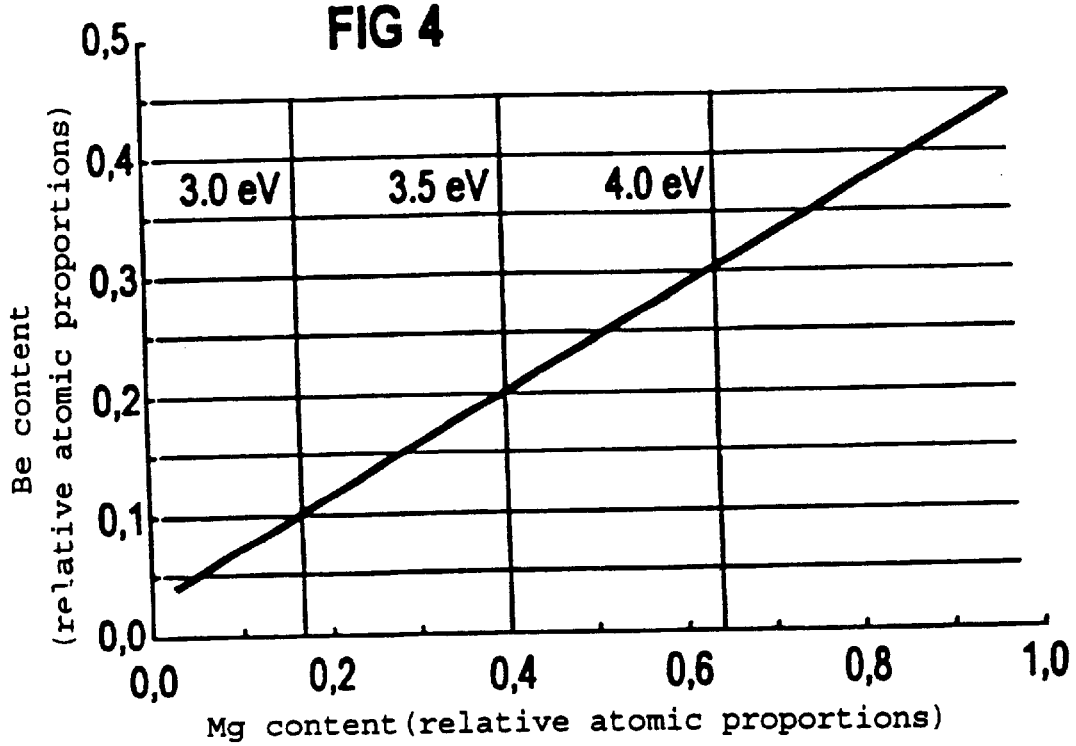

OPTO-ELECTRONIC COMPONENT MADE FROM II-VI SEMICONDUCTOR MATERIAL

CROSS-REFERENCE TO RELATED APPLICATION

This application is a division of U.S. Ser. No. 09/068,138, filed May 1, 1998, which issued as U.S. Pat. No. 6,265,734 on Jul. 24, 2001.

BACKGROUND OF THE INVENTION

The article by A. Ishibashi: "II–VI Blue-Green Laser Diodes" *IEEE Journal of Selected Topics in Quantum Electronics*, Vol. 1, pp. 741 to 748 (1995) provides an overview of the use of II–VI semiconductor material for the production of laser diodes which emit blue or green light. ZnMgSSe, ZnCdSe or ZnSe and ZnTe is specified as the material. An MQW structure made of ZnTe/ZnSe is also mentioned. JP-A 7-66 494 and U.S. Pat. No. 5,268,918 describe beryllium-containing semiconductor compositions for the production of laser diodes emitting blue or green. U.S. Pat. No. 5,422,902 and the articles by P. M. Mensz: "BeTe/ZnSe graded band gap ohmic contacts to p-ZnSe" *Appl. Phys. Lett.*, Vol. 64, pp. 2148 to 2150 (1994) and by R. G. Dandrea et al.: "Design of ohmic contacts to p-ZnSe" *Appl. Phys. Lett.*, Vol. 64, pp. 2145 to 2147 (1994) describe the use of a graded sequence of layers of BeTe and ZnSe for the production of contact layers between an active layer and a metallic connection contact.

The structures and materials described in the cited publications have a variety of disadvantages which have an adverse effect on the use for laser diodes. The difficulties arising when using ZnSe are that the growth of such layers on a GaAs substrate is disturbed, that a poor transport of charge carriers takes place via the interface between the II–VI semiconductor and the III–V semiconductor, and that good lattice matching of ZnTe to GaAs is not possible, for example, owing to the difference in the lattice constants. In addition, good ohmic contact to metals cannot be produced on ZnSe having p-conducting doping.

SUMMARY OF THE INVENTION

The object of the present invention is to specify an optoelectronic component for radiation generation, in particular in the green and blue spectral region, which can be produced comparatively easily together with good functionality and a long service life. In particular, the intention is to overcome the difficulties which exist in the current prior art and have been partly described in the introduction.

In general terms, the present invention is an optoelectronic component on a substrate made of a material selected from the group of GaAs, InP, InGaAs, Si, Ge, GaP and ZnSe. An active layer is provided for radiation generation in which the active layer is formed a by a sequence of layers of alternating composition as a potential well (quantum well) with a superlattice. In this sequence of layers, a layer made of a beryllium-containing chalcogenide and a layer made of a II–VI semiconductor material having a different composition respectively succeed one another. The active layer is arranged between layers which are doped for electrical conductivities with mutually opposite signs and which have contacts to provide electrical connections for these layers.

Advantageous developments of the invention are as follows.

The beryllium-containing chalcogenide is BeTe, BeS or BeSe or a solid-solution composition which contains Be and Te or Be and Se or Be and S.

The beryllium-containing chalcogenide is BeTe and the II–VI semiconductor material having a different composition is ZnSe or ZnCdSe.

The active layer is arranged between barrier layers made of beryllium-containing chalcogenide.

The present invention is also an optoelectronic component. A layer of BeZnCdSe or BeZnCdS, which is provided for radiation generation, is arranged between layers which are doped for electrical conductivities having mutually opposite signs and have contacts to provide electrical connections for these layers.

Advantageous developments of this embodiment of the present invention are as follows.

The BeZnCdSe or BeZnCdS contain at least 3 atomic percent of beryllium.

The present invention is also an optoelectronic component on a substrate made of a material selected from the group of GaAs, InP, InGaAs, Si, Ge, GaP and ZnSe. An active layer is provided for radiation generation and is arranged between barrier layers. At least one mantle layer is made of a beryllium-containing chalcogenide. The mantle layer comprises a sequence of layers which are alternately made of beryllium-containing chalcogenide and a further II–VI semiconductor material and which form a superlattice.

The mantle layer is arranged between the active layer and the substrate. A buffer layer made of a beryllium-containing chalcogenide is arranged between the mantle layer and the substrate. The sequence of layers in the mantle layer adjoining this buffer layer forms a superlattice, and, at a distance from the buffer layer, the thicknesses of the layers made of beryllium-containing chalcogenide decrease in one direction. The thicknesses of the layers made of the further II–VI semiconductor material increase in this direction.

The substrate is III–V semiconductor material or silicon. The mantle layer is applied as a buffer layer to this substrate.

The mantle layer is arranged between a layer of GaAs or a substrate of GaAs or Si and a layer of II–VI semiconductor material.

The present invention is also an optoelectronic component on a substrate made of III–V semiconductor material or silicon, having an active layer which is provided for radiation generation and is arranged between barrier layers. A buffer layer containing BeTe is applied to the substrate.

The active layer and the barrier layers are either II–VI semiconductor materials or III–V semiconductor materials.

There is provided, on both sides of the active layer, a mantle layer which contains a sequence of layers which are alternately a beryllium-containing chalcogenide and a II–VI semiconductor material differing therefrom. The mantle layers form Bragg reflectors which act vertically with respect to the layer planes.

The present invention is also an optoelectronic component on a substrate made of a material selected from the group of GaAs, InP, InGaAs, Si, Ge, GaP and ZnSe. An individual layer of BeTe is provided between the substrate and a layer provided for radiation generation.

The substrate has n-conductive doping.

In order to form light-emitting diodes or laser diodes, the component according to the invention uses a layer structure of II–VI semiconductor material incorporating at least one beryllium-containing chalcogenide, which is to be understood as meaning a beryllium chalcogenide or a solid-solution composition based on a beryllium chalcogenide. Preferred chalcogens are Te, Se and S. In the text below, therefore, "beryllium-containing chalcogenide" refers to any desired salt, in particular a salt containing S, Se or Te, which contains Be as a cation or Be and as many other cations such as, for example, Mg or Zn, as desired. Preferred embodiments provide, in particular, a combination with ZnSe and with a GaAs substrate. However, it is also possible to use other substrates such as, for example, InP, InGaAs, ZnSe, Si, Ge, GaP or the like. BeTe, BeSe, BeS and solid-solution compositions of these beryllium chalcogenides with semiconductor materials such as, for example, ZnSe, ZnS, ZnTe and MgSe appear to be suitable, in particular, for the active layer or layer structure, as well as for mantle layers, which are to be understood in the text below and in the claims as meaning buffer layers, (additional) barrier layers (confinement layers), (also passive) waveguide layers, lattice layers, covering layers and layer portions or combinations of such layers. In addition, in the text below, II–VI semiconductor material can always refer specifically to a (further) beryllium-containing chalcogenide. Different embodiments are described in detail below with reference to the Figures.

BRIEF DESCRIPTION OF THE DRAWINGS

FIG. 3 shows a diagram in which the energy band gap is plotted against the lattice constant for important semiconductor compounds.

FIG. 4 shows a diagram in which the energy band gap of BeMgZnSe is plotted for different relative atomic proportions of Mg and Be.

DESCRIPTION OF THE PREFERRED EMBODIMENTS

Figure 1:
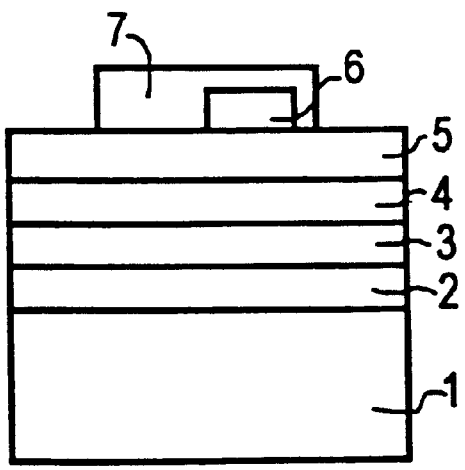
FIGS. 1 and 2 show components according to the invention in cross-section.

FIG. 1 illustrates a layer structure in which a transition layer or buffer layer 2, a lower barrier layer 3 (confinement), an active layer 4 and an upper barrier layer 5 are grown on a substrate 1. The lower and upper barrier layers can contain different layers for optical and electrical confinement. Passive waveguide layers (not illustrated) may be present between the barrier layers and the active layer. An aluminum contact 6 and, applied thereto, a Ti/Au contact 7 are illustrated as an example on the top side. A counter-contact, which is not illustrated, is situated, for example, on the underside of the substrate. The substrate and the layers between the substrate and the active layer 4 have, for example, p-conducting doping. The upper barrier layer 5 has, for example, n-conducting doping. However, the doping can also be carried out the other way around. According to one refinement of the invention, the carrier layers 3, 5 are made of beryllium-containing chalcogenide, for example BeMgZnSe. The active layer may be, for example, ZnSe.

The active layer is preferably an alternating layer sequence which forms an MQW structure or (given a correspondingly smaller layer thickness) a superlattice structure. Such an alternating layer sequence is preferably formed from alternating ZnSe and BeTe or, according to the current situation reached in testing, even better from alternating ZnCdSe and BeTe. With these material combinations, it is possible to adjust the energy band gap for determining the wavelength of the generated radiation between 1.8 eV and 2.9 eV. This entire range can be realized by using superlattices. The combination of the indirect semiconductor BeTe with a direct semiconductor such as, for example, ZnSe promotes light generation, and the refinement of this combination as a superlattice increases the efficiency, which is otherwise low owing to the so-called type II electron-hole transfer, which takes place only slowly, between BeTe and ZnSe. With very small layer thicknesses in this superlattice, the materials used are largely mixed together to form a BeZnSeTe composition, which changes at least in regions into a quaternary alloy or solid-solution composition. With these transition forms as a limiting case for possible embodiments, it is possible to obtain a very wide variation in the wavelength range that can be realized with a formula of $Be_xZn_yCd_{1-x-y}Se$. BeZnCdSe can also advantageously be used for the active zone. The beryllium proportion is in this case preferably at least 3 atomic percent ($x \geq 0.03$), which effects hardening, i.e. stabilization, of the crystal lattice. The zinc proportion may be zero ($y=0$). The lifetime of the device may be enhanced by using Be(Zn)CdS as a strained layer, for example on a GaAs substrate. The same applies to BeZnCdS.

It is possible for the ZnSe or the ZnCdSe in the example described to be replaced by another II–VI semiconductor material. For the layers of beryllium-containing chalcogenide, the layers are primarily made of BeTe, BeSe and solid-solution compositions of these beryllium chalcogenides. One or more quantum wells can in each case be formed by a layer of beryllium-containing chalcogenide in the active layer. A beryllium-containing active layer can also be combined with non-beryllium-containing barrier layers as boundaries. A beryllium chalcogenide or different beryllium chalcogenides can be used individually or jointly, for example, in the active layer or in the waveguide, in barrier layers or in other mantle layers. A further advantageous embodiment provides a beryllium chalcogenide-containing layer as mantle layer or as buffer layer between a substrate and a layer structure which comprises the active layer and is formed in a material system of a III–V semiconductor. Such a design is particularly suitable for largely integrated optoelectronic systems of the kind that can be arranged, for example, very well on silicon substrates. In this case, a structure of a conventional optoelectronic component made of III–V semiconductor materials can be arranged on a mantle or buffer layer made of a beryllium-containing chalcogenide, preferably BeTe, for example, on an Si substrate.

The transition layer or buffer layer 2, which can, in principle, be omitted in the embodiment, according to FIG. 1, has particular advantages when using beryllium chalcogenides, because with it the semiconductor material of the substrate 1 can be matched to the grown on further or additional layers. BeTe is particularly suitable for this buffer layer. This composition initially grows on a GaAs substrate significantly better than ZnSe, which is one of the customary semiconductor components for LEDs which emit blue. The buffer layer of BeTe on the substrate has a thickness of 50 nm, for example. The substrate temperatures used are in this case between 200° C. and 400° C.

A BeTe/ZnSe superlattice or a BeTe/ZnCdSe superlattice can also be used instead of a single BeTe layer as a buffer layer or in addition thereto, and the tensile and compressive stresses alternate in the event of a tensioned superlattice. In this case, the proposed materials have the particular advantage that the mean lattice constant of the superlattice can be matched very accurately, for example, to the lattice constant of the substrate by way of the ratio of the two layer thicknesses. By this means, very thick buffer layers of high quality can also be produced in a simple manner. The use of such superlattices also leads to the restriction of migrations of dislocations. Such migrations of dislocations into the active zone can reduce the service life of the component. The use of a buffer layer of BeTe or a composition with BeTe affords the additional advantage that a high electrical contact resistance does not occur at the interface between a substrate made of III–V semiconductor material and a following layer made of II–VI semiconductor material. If the buffer layer is entirely, or at least in an upper portion, facing the active layer, a beryllium-containing quaternary composition, for example a BeTeZnSe solid-solution composition, a gradual transition in the composition can ensure suitable matching of the electronic bands between the semiconductor material above and below it.

If the buffer layer 2 or a portion thereof forms a pseudo-grading in a non-periodic sequence of BeTe layers and ZnSe layers or ZnCdSe layers, where the BeTe/ZnSe or BeTe/ZnCdSe superlattice takes the place of a quaternary alloy with continually varying proportions, a low ohmic contact can be realized on ZnSe having p-conducting doping in a relatively simple manner. A pseudo-grading is a multiple-layer structure in which it is possible to match electronic bands and lattice constants between two materials. This structure is formed by a sequence of layers which are alternately composed of a material A and a material B, in the case of which the thickness of the layers of material A constantly decreases in one direction as the thickness of the layers of material B constantly increases in this direction. The total thickness of all these layers must be small enough to ensure efficient current transport, which depends on the materials A and B in each particular case.

In a preferred exemplary embodiment of the component according to the invention, a buffer layer is situated on a substrate and the buffer layer has a thickness, for example, of 50 nm and is made, for example, of BeTe, which buffer layer can also be omitted. A pseudo-grading is applied either on this buffer layer or directly on the substrate. The pseudo-grading is made of a sequence of mutually alternating BeTe layers and either ZnSe or ZnCdSe layers and matches the electronic bands and possibly also the lattice constants between the layers above and below it. In the case of this pseudo-grading, the thickness of the BeTe layers is reduced in the direction towards the active layer in small steps of, for example, 1 monolayer and the thickness of the Zn(Cd)Se layers is increased in small steps of, for example, 1 monolayer. The thickness of the individual layers must in this case be less than 50 nm. Layer thicknesses of less than 20 nm are particularly suitable. Starting, for example, with a layer thickness of 3.7 nm for the BeTe and a layer thickness of 0.3 nm for either the ZnSe or ZnCdSe, the layer thicknesses are changed down to 0.3 nm for the BeTe and up to 3.7 nm for the Zn(Cd)Se. This would produce, for example, a pseudo-grading between BeTe and either ZnSe or ZnCdSe. Two different beryllium-containing II–VI semiconductor materials, for example ternary or quaternary solid-solution compositions with Be, may be present instead of BeTe and either ZnSe or ZnCdSe.

The specified designs of a mantle layer, specifically described here using the example of a buffer layer, can also be combined with one another. In particular, the pseudo-grading and superlattice can be combined with one another. For example, it is possible to arrange a superlattice, which is formed by an alternating sequence of layers of constant thickness and different materials, between a buffer layer (for example made of BeTe) and a pseudo-grading of the kind described above. In the case of a laser diode, too, which is otherwise composed either of the conventional materials ZnSe and ZnMgSSe or of III–V semiconductor material, it is possible to achieve a significant improvement and also a simplification during production by means of either a beryllium-containing layer or layer structure between a substrate made either of III–V semiconductor material or of silicon and the layers subsequently grown on and made either of II–VI semiconductor materials or of III–V semiconductor materials, which comprise the active layer.

A further embodiment has, as barrier layers 3, 5, double or multiple layers with layer portions made of aberyllium chalcogenide, for example layer sequences of BeTe and ZnSe. The direct energy band gap of BeTe was determined at 4.05 eV. Older figures are thus corrected. Using the new value, a jump in the conduction band at the gamma point of about 2.1 eV is obtained for the transition between BeTe and ZnSe. Since the epitaxial growth of these compounds leads to very smooth interfaces, it is thus possible to produce double or multiple layers as barrier layers (confinement layers). Structures of this type can also be realized as MQW structures with either BeTe/ZnSe or BeTe/ZnCdSe. Such MQW structures can also be used, for example, for the production of ohmic contacts on ZnSe having p-conducting doping, and this can be done in a manner corresponding to that specified for ZnSe and ZnTe in the Ishibashi article cited in the introduction.

Figure 2:
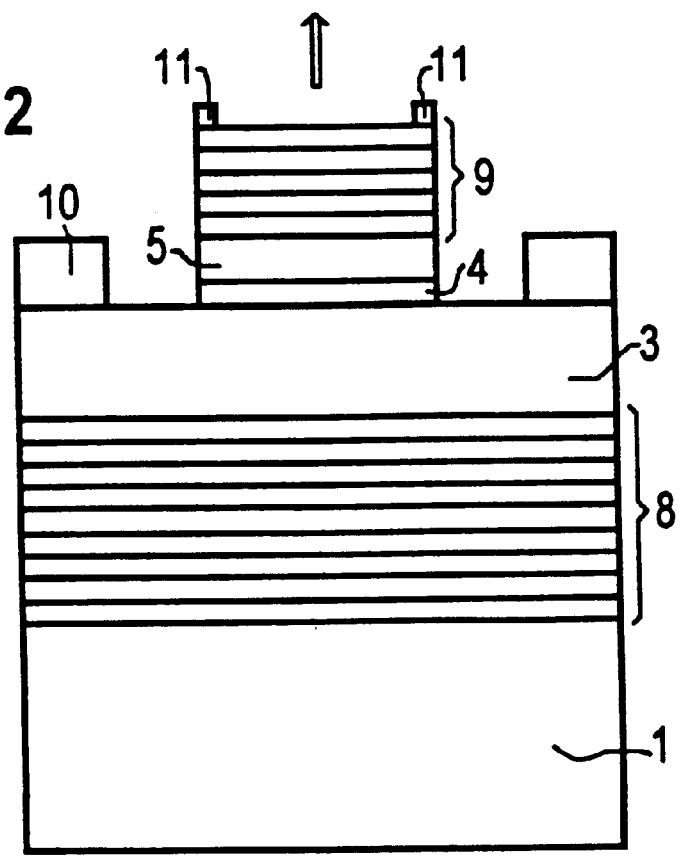

In the embodiment illustrated in FIG. 2, a layer sequence as a lower lattice structure 8, a lower barrier layer 3 (confinement layer), an active layer 4, an upper barrier layer 5 and a layer sequence as an upper lattice structure 9 are situated on a substrate 1. In this exemplary embodiment, the active layer 4 and the layers grown thereon are structured as a mesa. The lower barrier layer 3 has, for example, n-conducting doping and is composed, for example, of BeMgZnSe. The associated n-type contact 10 is, in this example, applied all around the edge of the top side. The upper barrier layer 5 is then p-conducting, is likewise composed, for example of BeMgZnSe and is electrically conductively connected to the p-type contact 11. The p-type contact 11 can be applied directly to the upper barrier layer 5 or be conductively connected to the upper barrier layer 5 by means of the upper lattice structure 9, which then likewise has conductive doping. In the example of FIG. 2, the p-type contact 11 is applied in the form of a ring on the upper edge of the mesa, with the result that, in the interior of this metal ring, the radiation generated in the active layer 4 can issue upwards in the direction of the arrow, as illustrated. The active layer 4 forms, for example, a potential well (quantum well) made of ZnSe. Other compositions made of II–VI semiconductor materials can also be used for the active layer 4 and the barrier layers 3 and 5.

The lattice structures 8, 9, which are provided for a vertical laser resonator, form an upper and a lower Bragg reflector. In the diode according to the invention, these lattice structures are formed by layer sequences in which layers of either a beryllium chalcogenide or a solid-solution composition based on a beryllium chalcogenide and layers of a further II–VI semiconductor material are arranged alternately one over the other. ZnSe and solid-solution compositions of ZnSe with other II–VI semiconductor materials can be used, in particular, as this further II–VI semiconductor material. In this case, BeTe is particularly suitable as the beryllium chalcogenide. In a preferred exemplary embodiment, the lattice structures are sequences of mutually alternating BeTe layers and either ZnSe or ZnCdSe layers. Owing to the provided direct energy band gap of 4.05 eV of BeTe, the jump in the refractive index between BeTe and Zn(Cd)Se is large enough to be able to produce an efficient Bragg reflector with this alternating layer sequence. In this embodiment, too, it is possible to dope the lower lattice structure 8 and the substrate (for example GaAs) in an electrically conductive manner and to apply the corresponding contact to the underside of the substrate. In this case, too, potential wells or MQW structures made of BeTe and either ZnSe or ZnCdSe can be used for the active layer and the barrier layers.

The component according to the invention shows how beryllium chalcogenides of very diverse compositions can be used either for the active layer of a radiation-generating component or for mantle layers. Preferably suitable compositions are beryllium-containing tellurides and beryllium-containing selenides. In the examples specified, BeTe can be replaced in each case by a suitable alternative beryllium chalcogenide. Blue- or green-emitting LEDs or laser diodes using conventional III–VI semiconductor materials, in particular based on ZnSe, can likewise advantageously be modified in accordance with the invention by means of beryllium chalcogenide layers.

What is claimed is:

1. An optoelectronic component on a substrate made of a material selected from the group consisting of GaAs, Si, Ge, GaP, and ZnSe, said component comprising:

an active layer for radiation generation being arranged between barrier layers;

a buffer layer including a sequence of layers being arranged between said substrate and said active layer;

the sequence of layers having layers succeeding one another and being alternatively made and a first layer of BeTe and a second layer of a second material selected from a group consisting of ZnSe and ZnCdSe;

the sequence of layers comprising a pseudo-grading with a thickness of the first layers made of BeTe decreasing in one direction, and a thickness of the second layers made of the second material, increasing in said direction; and a second sequence of layers comprising a superlattice with a thickness of first layers made of BeTe being constant, and a thickness of second layers made of the second materials being constant.

2. An optoelectronic component according to claim 1, wherein the active layer and the barrier layers are III–V semiconductor materials.

3. An optoelectronic component according to claim 1, wherein the active superlattice is arranged between said substrate and said pseudo-grading.

4. An optoelectronic component on a substrate made of a material selected from a group consisting of GaAs and silicon, said component comprising:

an active layer for radiation generation, said active layer being arranged between barrier layers;

the active layer and the barrier layers being II–VI semiconductor materials; and a buffer layer being made of BeTe being located between the substrate and the active layer.

* * * * *

UNITED STATES PATENT AND TRADEMARK OFFICE
CERTIFICATE OF CORRECTION

PATENT NO. : 6,495,859 B2
DATED : December 17, 2002
INVENTOR(S) : Frank Fischer et al.

It is certified that error appears in the above-identified patent and that said Letters Patent is hereby corrected as shown below:

Column 8,
Line 14, cancel "active".

Signed and Sealed this

Twelfth Day of August, 2003

JAMES E. ROGAN
*Director of the United States Patent and Trademark Office*